(12) United States Patent
Nakamura et al.

(10) Patent No.: US 10,128,457 B2
(45) Date of Patent: Nov. 13, 2018

(54) LIGHT-EMITTING DEVICE AND POWER-GENERATING DEVICE

(71) Applicant: Asahi Glass Company, Limited, Chiyoda-ku (JP)

(72) Inventors: Nobuhiro Nakamura, Chiyoda-ku (JP); Naomichi Miyakawa, Chiyoda-ku (JP); Satoru Watanabe, Chiyoda-ku (JP); Toshinari Watanabe, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 15/459,278

(22) Filed: Mar. 15, 2017

(65) Prior Publication Data

US 2017/0186990 A1 Jun. 29, 2017

Related U.S. Application Data

(63) Continuation of application No. PCT/JP2015/075347, filed on Sep. 7, 2015.

(30) Foreign Application Priority Data

Sep. 18, 2014 (JP) .................. 2014-190360

(51) Int. Cl.
*H01L 51/52* (2006.01)
*H01L 27/12* (2006.01)
*H01L 33/10* (2010.01)

(52) U.S. Cl.
CPC ...... *H01L 51/5203* (2013.01); *H01L 51/5268* (2013.01)

(58) Field of Classification Search
CPC ..... H01L 51/52; H01L 51/50; H01L 51/5203; H01L 51/5268
(Continued)

(56) References Cited

U.S. PATENT DOCUMENTS

2008/0100202 A1\* 5/2008 Cok ............... C23C 16/306
313/503
2008/0278067 A1 11/2008 Tyan et al.
(Continued)

FOREIGN PATENT DOCUMENTS

JP 1-314918 A 12/1989
JP 2004-182490 7/2004
(Continued)

OTHER PUBLICATIONS

JP2014-27192 English translation.\*
(Continued)

*Primary Examiner* — Sheikh Maruf
(74) *Attorney, Agent, or Firm* — Oblon, McClelland, Maier & Neustadt, L.L.P.

(57) ABSTRACT

A light-emitting device having a light-extraction structure includes: a first electrode; a second electrode; a light-emitting layer disposed between the first electrode and the second electrode; and an inorganic-material-based layer disposed between the first electrode and the light-emitting layer or between the second electrode and the light-emitting layer. The inorganic-material-based layer has thickness of 100 nm or more and has conductivity of $10^{-6}$ $\Omega^{-1}$ $cm^{-1}$ or more and 100 $\Omega^{-1}$ $cm^{-1}$ or less.

9 Claims, 12 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2009/0153972 A1 | 6/2009 | Nakamura et al. | |
| 2011/0200293 A1 | 8/2011 | Zhang et al. | |
| 2011/0284907 A1 | 11/2011 | Nakamura et al. | |
| 2011/0290322 A1* | 12/2011 | Meguro | H01L 31/02246 136/256 |
| 2013/0334511 A1* | 12/2013 | Savas | H01L 51/56 257/40 |
| 2015/0076452 A1* | 3/2015 | Setz | H01L 51/5262 257/40 |
| 2015/0108445 A1* | 4/2015 | Schicktanz | H01L 51/5203 257/40 |
| 2015/0188089 A1* | 7/2015 | Bhandari | H01L 51/5262 257/40 |
| 2016/0111684 A1* | 4/2016 | Savas | H01L 51/5256 257/40 |
| 2016/0149153 A1* | 5/2016 | Scharner | H01L 51/5206 257/40 |
| 2016/0233455 A1* | 8/2016 | Riedel | H01L 51/5203 |

FOREIGN PATENT DOCUMENTS

| | | |
|---|---|---|
| JP | 2009-9861 | 1/2009 |
| JP | 2010-183137 A | 8/2010 |
| JP | 2010-527107 | 8/2010 |
| JP | 2011-24225 A | 2/2011 |
| JP | 2012-59417 | 3/2012 |
| JP | 2012-512518 | 5/2012 |
| JP | 2014-27192 | 2/2014 |
| JP | 2014-27192 A * | 2/2014 |
| WO | WO 2009/017035 A1 | 2/2009 |
| WO | WO 2014/020850 A1 | 2/2014 |

OTHER PUBLICATIONS

International Search Report issued Nov. 24, 2015 in PCT/JP2015/075347, filed on Sep. 7, 2015 (with English Translation).
Written Opinion Issued Nov. 24, 2015 in PCT/JP2015/075347, filed on Sep. 7, 201 5.

* cited by examiner

LIGHT-EMITTING DEVICE AND POWER-GENERATING DEVICE

CROSS-REFERENCE TO RELATED APPLICATIONS

The present application is a continuation application of International Application No. PCT/JP2015/075347, filed Sep. 7, 2015, which claims priority to Japanese Patent Application No. 2014-190360, filed Sep. 18, 2014. The contents of these applications are incorporated herein by reference in their entirety.

BACKGROUND OF THE INVENTION

1. Field of the Invention

The present invention relates to light-emitting devices, such as organic light emitting diodes (LEDs), and power-generating devices.

2. Description of the Related Art

Light-emitting devices such as organic LEDs have been widely used for purposes such as displays, backlights and illumination.

A light-emitting device in general includes, on a substrate, a first electrode, a second electrode, and a light-emitting layer disposed between the electrodes. When electric voltage is applied to the electrodes, holes and electrons are injected from each of the electrodes into the light-emitting layer. Recombination of the holes and electrons inside the light-emitting layer generates binding energy, which excites light-emitting material inside the light-emitting layer. When the excited light-emitting material returns to the ground state, light emission occurs, and the light may be extracted outside, taking advantage of the light emission.

In recent years, a light-emitting device provided with various types of light-extraction structures has been proposed, in order to enhance light-extraction efficiency of the light-emitting device.

For example, according to International Publication No. WO/2009/017035, light-extraction efficiency of a light-emitting device is enhanced by providing, between a glass substrate and a clear electrode, a scattering layer with high refractive index. Furthermore, according to Japanese Translation of OCT International Application Publication No. JP-T-2012-512518, Japanese Unexamined Patent Application Publication No. 2009-9861, and Japanese Unexamined Patent Application Publication No. 2004-182490, light-extraction efficiency of a light-emitting device is enhanced by providing a diffracting structure, a corrugated structure, and a layer with a low refractive index, as a light-extraction structure, respectively.

SUMMARY OF THE INVENTION

As described above, a light-emitting device provided with various types of light-extraction structures has been proposed to date, in order to enhance light-extraction efficiency of the light-emitting device.

However, there has been a concern that an extraneous substance often remains on a surface in a process for manufacturing such a light-emitting device provided with a light-extraction structure.

Such a remaining extraneous substance may cause deterioration in flatness and uniformity of layers formed in subsequent film-formation processes. Furthermore, deterioration in flatness and uniformity of each layer increases a risk for short-circuiting between the two electrodes, which should be apart from each other via the light-emitting layer. In such a case, there is a concern that a manufactured light-emitting device may not have a desired attribute. The problem is similar with respect to a power-generating device as well.

Based on the background as described above, an object of the present invention is to provide a light-emitting device that does not easily short-circuit between the first electrode and the second electrode.

Furthermore, another object of the present invention is to provide a power-generating device that does not easily short-circuit between the first electrode and the second electrode.

One aspect of the present invention provides a light-emitting device having a light-extraction structure. The light-emitting device includes: a first electrode; a second electrode; a light-emitting layer disposed between the first electrode and the second electrode; and an inorganic-material-based layer disposed between the first electrode and the light-emitting layer or between the second electrode and the light-emitting layer. The inorganic-material-based layer has thickness of 100 nm or more and has conductivity of $10^{-6}$ $\Omega^{-1}$ $cm^{-1}$ or more and 100 $\Omega^{-1}$ $cm^{-1}$ or less.

Furthermore, one aspect of the present invention provides a power-generating device. The power-generating device includes: a first electrode; a second electrode; a power-generating layer disposed between the first electrode and the second electrode; and an inorganic-material-based layer disposed between the first electrode and the power-generating layer or between the second electrode and the power-generating layer. The inorganic-material-based layer has thickness of 100 nm or more and has conductivity of $10^{-6}$ $\Omega^{-1}$ $cm^{-1}$ or more and 100 $\Omega^{-1}$ $cm^{-1}$ or less.

According to the present invention, a light-emitting device that does not easily short-circuit between the first electrode and the second electrode may be provided.

Furthermore, according to the present invention, a power-generating device that does not easily short-circuit between the first electrode and the second electrode may be provided.

DESCRIPTION OF THE EMBODIMENTS

The following description explains an embodiment of the present invention, with reference to accompanying drawings.

(Conventional Light-Emitting Device)

The following is an explanation of a configuration of a conventional light-emitting device, for providing better understanding of features of the present invention. Here, a configuration of a conventional light-emitting device is explained along with an example of an organic LED element as disclosed in International Publication No. WO/2009/017035.

Figure 1:
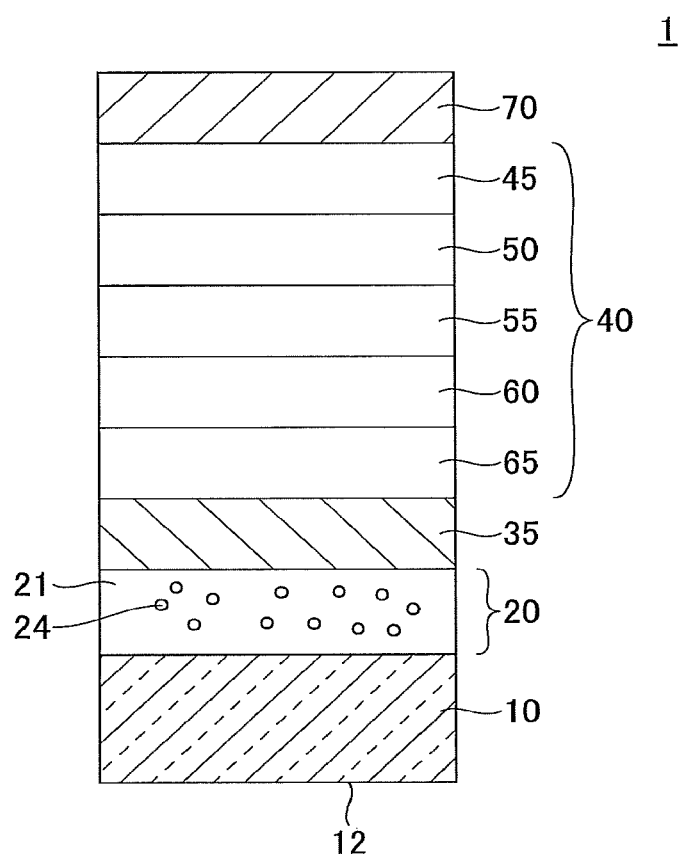
FIG. 1 is a drawing schematically illustrating a cross-section of a conventional organic LED element.

In FIG. 1, a simplified cross-sectional view of a conventional organic LED element 1 is illustrated.

As illustrated in FIG. 1, the conventional organic LED element 1 includes a glass substrate 10, a clear electrode (i.e. a first electrode) 35, an organic layer 40, a reflective electrode (i.e. a second electrode) 70, in the illustrated order.

The clear electrode (i.e. the first electrode) 35 functions as either one of an anode or a cathode, and the reflective electrode (i.e. the second electrode) 70 functions as a counterpart electrode of either one of the anode or the cathode.

The organic layer 40 is constituted by an electron-injection layer 45, an electron-transport layer 50, an organic light-emitting layer 55, a hole-transport layer 60, and a hole-injection layer 65. Here, with respect to the organic layer 40, one or more layers except for the organic light-emitting layer 55 may be omitted.

In the example of FIG. 1, the clear electrode (i.e. the first electrode) 35 functions as an anode, and the reflective electrode (i.e. the second electrode) 70 functions as a cathode. In this case, the organic layer 40 is constituted by layers laminated in an order as follows, starting from the layer closest to the clear electrode (i.e. the first electrode) 35: the hole-injection layer 65, the hole-transport layer 60, the organic light-emitting layer 55, the electron-transport layer 50, and the electron-injection layer 45.

In a case where the clear electrode (i.e. the first electrode) 35 functions as a cathode, and the reflective electrode (i.e. the second electrode) functions as an anode, the organic layer 40 is constituted by layers laminated in an order as follows, starting from the layer closest to the clear electrode (i.e. the first electrode) 35: the electron-injection layer 45, the electron-transport layer 50, the organic light-emitting layer 55, the hole-transport layer 60, and the hole-injection layer 65.

Note that, in the example of FIG. 1, the bottom surface of the organic LED element 1 (i.e. the exposed surface of the glass substrate 10) is a light-extraction surface 12.

Here, the conventional organic LED element 1 may include a scattering layer 20 between the glass substrate 10 and the clear electrode 35, in order to improve extraction of light. The scattering layer 20 is constituted by a base material 21, which is made of glass and has a first refractive index, and by multiple scattering substances 24, which are dispersed inside the base material 21 and have a second refractive index that is different from the refractive index of the base material 21.

The scattering layer 20 functions as a light-extraction structure. That is to say, the scattering layer 20 has a function to effectively scatter light emitted by the organic light-emitting layer 55 in order to reduce the amount of total reflection inside the organic LED element 1. Thus, with respect to the organic LED element 1 having the configuration as illustrated in FIG. 1, the amount of light emitted from the light-extraction surface 12 is enhanced.

However, with respect to the organic LED element 1 having the light-extraction structure (i.e. the scattering layer 20), there is a concern, in a film-formation process for forming the scattering layer 20, that an extraneous substance may be attached to and remain on a surface. Such an extraneous substance may cause deterioration in flatness and uniformity of layers to be formed in subsequent film-formation processes for forming each of the clear electrode 35, the hole-injection layer 65, the hole-transport layer 60, the organic light-emitting layer 55, the electron-transport layer 50, the electron-injection layer 45, and the reflective electrode 70. In a case where the flatness and the uniformity of the layers are deteriorated to an unacceptable extent, a risk for short-circuiting between the two electrodes (i.e. the clear electrode 35 and the reflective electrode 70), which should be apart from each other via the organic layer 40, is increased. In such a case, there is a concern that the manufactured organic LED element 1 may not have a desired attribute.

Note that there is the same concern with respect to light-emitting devices having other types of light-extraction structures (e.g. a diffracting structure, a corrugated structure, a layer with a low refractive index), other than the organic LED element 1 having the scattering layer 20.

In the present invention, the light-extraction structure is for effectively scattering light emitted by the organic light-emitting layer 55 in order to decrease the amount of total reflection inside the organic LED element 1, and therefore, as long as the same effect is obtained, the light-extraction structure is not limited to a scattering layer, a diffracting structure (see, Japanese Translation of PCT International Application Publication No. JP-T-2012-512518), a corrugated structure (see, Japanese Unexamined Patent Application Publication No. 2009-9861), or a layer with a low refractive index (see, Japanese Unexamined Patent Application Publication No. 2004-182490).

With respect to the above, one aspect of the present invention provides a light-emitting device having a light-extraction structure. The light-emitting device includes: a first electrode; a second electrode; a light-emitting layer disposed between the first electrode and the second electrode; and an inorganic-material-based layer disposed between the first electrode and the light-emitting layer or between the second electrode and the light-emitting layer.

The inorganic-material-based layer has thickness of 100 nm or more and has conductivity of $10^{-6}$ $\Omega^{-1}$ $cm^{-1}$ or more and 100 $\Omega^{-1}$ $cm^{-1}$ or less.

The light-emitting device according to an aspect of the present invention is provided with a relatively thick inorganic-material-based layer, which is more than 100 nm thick, at a selectable position between the two electrodes. By disposing such a thick inorganic-material-based layer, flatness of the two electrodes and each layer disposed between the two electrodes is significantly improved, even though an extraneous substance remains on a surface in a process of forming the light-extraction structure. As a result, a risk for short-circuiting between the two electrodes may be significantly decreased.

Disposition of a simply "thick layer" between the two electrodes may be a solution to a risk for short-circuiting between the electrodes. However, it should be noted that there is a high possibility of negatively affecting mobility of electrons and/or holes and conductivity, which may cause the light-emitting device to lose a desired attribute.

With respect to the above, according to an aspect of the present invention, conductivity of the thick inorganic-material-based layer provided on the light-emitting device is in a range of $10^{-6}$ $\Omega^{-1}$ $cm^{-1}$ or more and 100 $\Omega^{-1}$ $cm^{-1}$ or less.

The thick inorganic-material-based layer has preferable electron-mobility and conductivity, which are high enough to be suitable for an electron-injection layer, etc., as well. Therefore, according to an aspect of the present invention, disposition of a thick inorganic-material-based layer may decrease the risk for short-circuiting between the electrodes, without negatively affecting attributes of the light-emitting device.

The thick inorganic-material-based layer may be amorphous, microcrystalline, or in a mixed state of amorphous and microcrystalline.

Additionally, at least one of material for the thick inorganic-material-based layer may be selected from a group consisting of zinc-tin-silicon-oxygen-based material, zinc-tin-oxygen-based material, and zinc-silicon-oxygen-based material. Other material for the thick inorganic-material-based layer may be zinc-tin-germanium-oxygen-based material.

In a case where the thick inorganic-material-based layer is formed by zinc-silicon-oxygen-based material, it is preferable that the thick inorganic-material-based layer contains zinc (Zn), silicon (Si), and oxygen (O) at an atomic fraction where Zn/(Zn+Si) is 0.30 to 0.95, because such an atomic fraction is suitable for obtaining the aforementioned conductivity and for forming a highly flat inorganic-material-based layer. Other material for the thick inorganic-material-based layer may be indium-silicon-oxygen-based material, indium-gallium-zinc-oxygen-based material, indium-zinc-oxygen-based material, or germanium-zinc-oxygen-based material.

Further, in a case where the thick inorganic-material-based layer is formed by zinc-tin-silicon-oxygen-based material, the thick inorganic-material-based layer contains zinc (Zn), tin (Sn), silicon (Si), and oxygen (O), and, in terms of oxide, $SnO_2$ is preferably in a range of 15 mol % or more and 95 mol % or less, with respect to 100 mol % total oxide in the inorganic-material-based layer, because such a percentage is suitable for forming a highly flat inorganic-material-based layer and for obtaining the aforementioned conductivity. Furthermore, here, it is more preferable that, in terms of oxide, $SiO_2$ is in a range of 7 mol % or more and 30 mol % or less, with respect to 100 mol % total oxide in the inorganic-material-based layer, because such a percentage is suitable for obtaining the aforementioned conductivity, preventing electron-affinity and volume-resistivity from becoming too large.

Further, in a case where the thick inorganic-material-based layer is formed by zinc-tin-oxygen-based material, the thick inorganic-material-based layer contains zinc (Zn), tin (Sn), and oxygen (O), and, in terms of oxide, $SnO_2$ is preferably in a range of 15 mol % or more and 95 mol % or less, with respect to 100 mol % total oxide in the inorganic-material-based layer, because such a percentage is suitable for forming a highly flat inorganic-material-based layer, for maintaining a state of a thin film, which may be amorphous, microcrystalline, or in a mixed state of amorphous and microcrystalline, for obtaining the aforementioned conductivity, and for easily obtaining a film-forming use oxide target for advantageously forming a thin film.

(Light-Emitting Device According to the Embodiment of the Present Invention)

Figure 2:
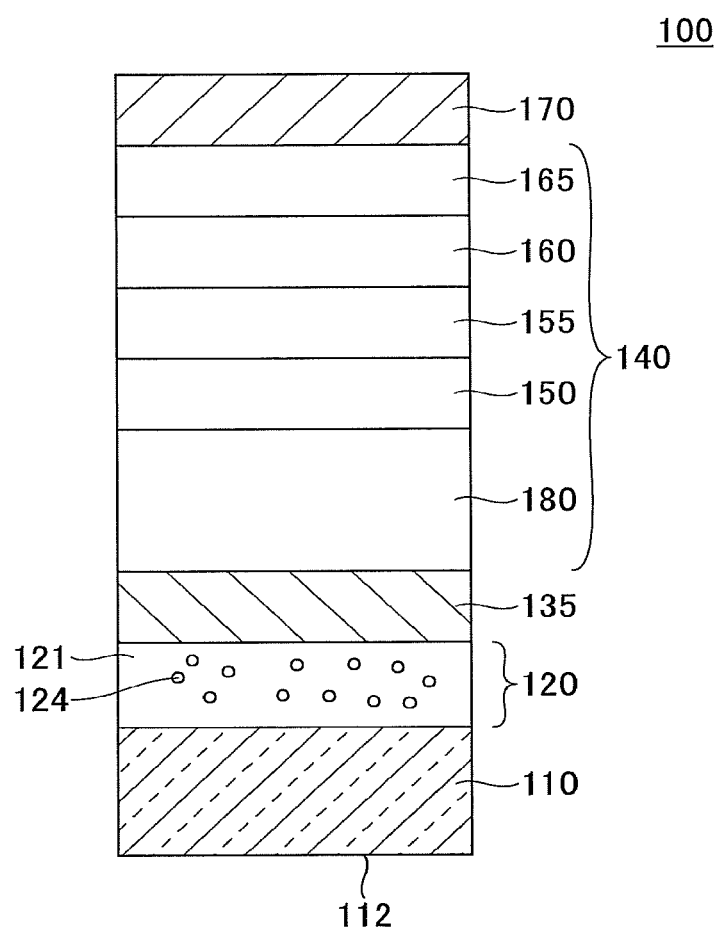
FIG. 2 is a drawing schematically illustrating a cross-section of a light-emitting device according to an aspect of the present invention.

The following description further explains the configuration of the light-emitting device according to an aspect of the present invention, with reference to FIG. 2. FIG. 2 is a drawing schematically illustrating a cross-sectional configuration of the light-emitting device (i.e. an organic LED element) according to an aspect of the present invention.

As illustrated in FIG. 2, the light-emitting device (which may be hereinafter referred to as a "first light-emitting device") 100 according to an aspect of the present invention includes a clear substrate 110, a scattering layer 120, which functions as a light-extraction structure, a clear electrode (i.e. cathode) 135, an organic layer 140, a reflective electrode (i.e. anode) 170, in the illustrated order.

The scattering layer 120 is constituted by a base material 121, which is made of glass and has a first refractive index, and by multiple scattering substances 124, which are dispersed inside the base material 121 and have a second refractive index that is different from the refractive index of the base material 121.

In the example of FIG. 2, the bottom surface of the first light-emitting device 100 (i.e. the exposed surface of the clear substrate 110) is a light-extraction surface 112.

The organic layer 140 includes layers laminated in an order as follows, starting from the layer closest to the clear electrode 135: an electron-injection layer 180, an electron-transport layer 150, an organic light-emitting layer 155, a hole-transport layer 160, and a hole-injection layer 165.

With respect to the first light-emitting device 100, the electron-injection layer 180 is formed so as to be more than 100 nm thick and to have conductivity in a range of $10^{-6}$ $\Omega^{-1}$ $cm^{-1}$ or more and 100 $\Omega^{-1}$ $cm^{-1}$ or less. Additionally, material for the electron-injection layer 180 is inorganic material selected from the group consisting of zinc-tin-silicon-oxygen-based material, zinc-tin-oxygen-based material, and zinc-silicon-oxygen-based material.

In a case where the electron-injection layer 180 is configured to be such a thick inorganic-material-based layer, the aforementioned risk for short-circuiting between the two electrodes (i.e. the clear electrode 135 and the reflective electrode 170) may be significantly decreased. That is to say, with respect to the first light-emitting device 100, existence of such a thick inorganic-material-based layer as the electron-injection layer 180 may significantly improve flatness and uniformity of each of the layers (i.e. the electron-transport layer 150 through to the reflective electrode 170) formed in subsequent processes, even though an extraneous substance remains on a surface in a process for forming the scattering layer 120. As a result, the risk for short-circuiting between the two electrodes (i.e. the clear electrode 135 and the reflective electrode 170) may be significantly decreased.

Regarding the thick inorganic-material-based layer, an amorphous state or a primarily amorphous state is more suitable for obtaining a flat film. Furthermore, regarding the thick inorganic-material-based layer, an amorphous state or a primarily amorphous state is more suitable for controlling electrical current to be provided to the film, because electron-affinity and composition tend to have a linear relationship. Furthermore, regarding the thick inorganic-material-based layer, an amorphous state or a primarily amorphous state is more suitable for obtaining layer-uniformity. Furthermore, regarding the thick inorganic-material-based layer, a primarily microcrystalline state is more suitable for enhancing electronic attributes with respect to a layer-thickness direction, because orientation with respect to the layer-thickness direction tends to be observed in a microcrystalline state, compared to in an amorphous state.

(Another Light-Emitting Device (1) According to the Embodiment of the Present Invention)

Figure 3:
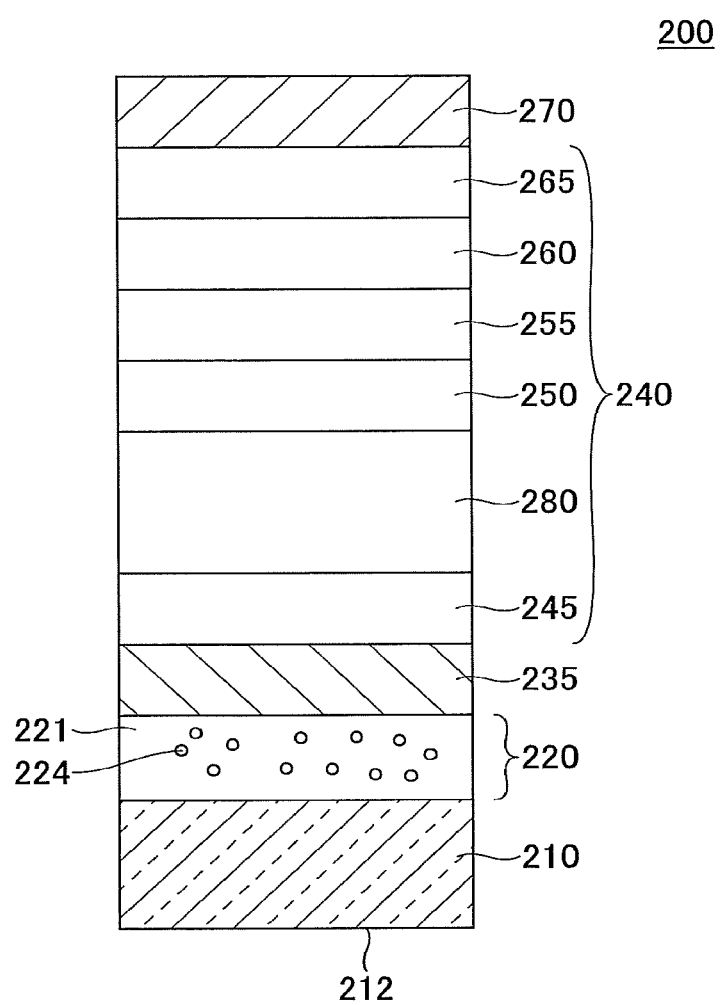
FIG. 3 is a drawing schematically illustrating a cross-section of another light-emitting device (1) according to an aspect of the present invention.

The following description explains a configuration of another light-emitting device (1) according to an aspect of the present invention, with reference to FIG. 3. FIG. 3 is a drawing schematically illustrating a cross-sectional configuration of another light-emitting device (i.e. an organic LED element) 200 according to an aspect of the present invention.

As illustrated in FIG. 3, said another light-emitting device (which may be hereinafter referred to as a "second light-emitting device") 200 according to an aspect of the present invention basically has a similar configuration to the configuration of the first light-emitting device 100 illustrated in FIG. 2.

However, the second light-emitting device 200 is different from the first light-emitting device 100, in an aspect that an organic layer 240 includes both an electron-injection layer 245 and a thick inorganic-material-based layer 280. That is to say, the organic layer 240 of the second light-emitting device 200 includes layers laminated in an order as follows: the electron-injection layer 245, the thick inorganic-material-based layer 280, an electron-transport layer 250, an organic light-emitting layer 255, a hole-transport layer 260, and a hole-injection layer 265.

As described above, the thick inorganic-material-based layer 280 is formed so as to be more than 100 nm thick and to have conductivity in a range of $10^{-6}$ $\Omega^{-1}$ $cm^{-1}$ or more and 100 $\Omega^{-1}$ $cm^{-1}$ or less. Additionally, material for the thick inorganic-material-based layer 280 is selected from the group consisting of zinc-tin-silicon-oxygen-based material, zinc-tin-oxygen-based material, and zinc-silicon-oxygen-based material.

It is obvious for a person skilled in the art that, similarly to the first light-emitting device 100, the risk for short-circuiting between two electrodes (i.e. a clear electrode 235 and a reflective electrode 270) may be significantly decreased because of such a configuration. Furthermore, with respect to the second light-emitting device 200, it should be easily understood that existence of the thick inorganic-material-based layer 280 is not associated with a possibility to negatively affect attributes of the second light-emitting device 200.

(Another Light-Emitting Device (2) According to the Embodiment of the Present Invention)

Figure 4:
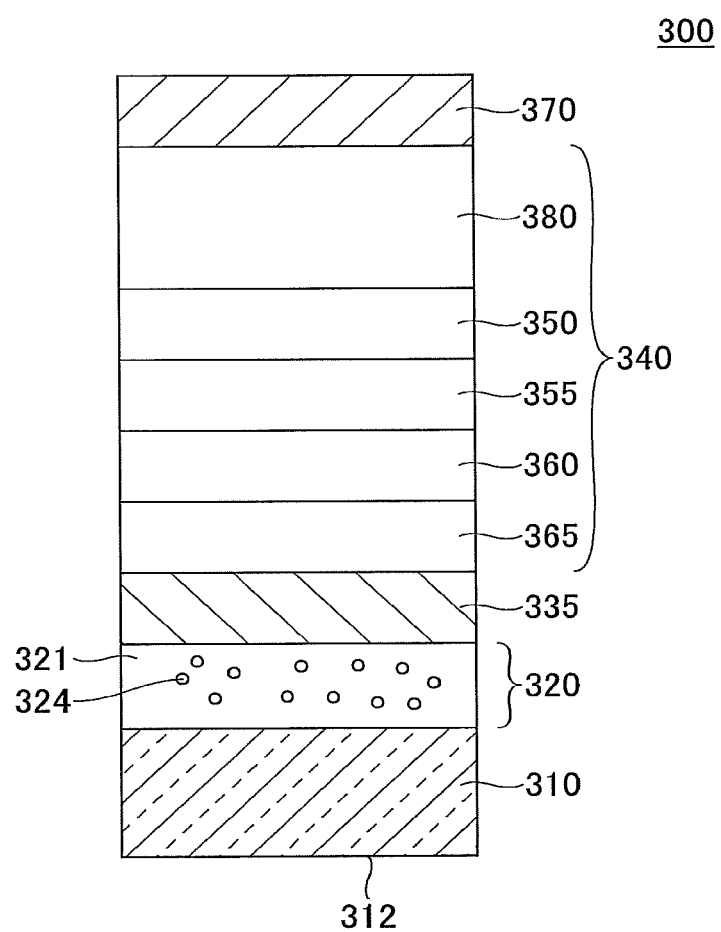
FIG. 4 is a drawing schematically illustrating a cross-section of another light-emitting device (2) according to an aspect of the present invention.

The following description explains a configuration of another light-emitting device (2) according to an aspect of the present invention, with reference to FIG. 4. FIG. 4 is a drawing schematically illustrating a cross-sectional configuration of another light-emitting device (i.e. an organic LED element) 300 according to an aspect of the present invention.

As illustrated in FIG. 4, said another light-emitting device (which may be hereinafter referred to as a "third light-emitting device") 300 according to an aspect of the present invention includes layers laminated in an order as follows: a clear substrate 310, a scattering layer 320, a clear electrode (i.e. an anode) 335, an organic layer 340, and a reflective electrode (i.e. a cathode) 370. The scattering layer 320 is constituted by a base material 321, which is made of glass and has a first refractive index, and by multiple scattering substances 324, which are dispersed inside the base material 321 and have a second refractive index that is different from the refractive index of the base material 321.

In the example of FIG. 4, the bottom surface of the third light-emitting device 300 (i.e. the exposed surface of the clear substrate 310) is a light-extraction surface 312.

The organic layer 340 includes layers laminated in an order as follows, starting from the layer closest to the clear electrode 335: a hole-injection layer 365, a hole-transport layer 360, an organic light-emitting layer 355, an electron-transport layer 350, and an electron-injection layer 380.

Here, the electron-injection layer 380 is formed to be a thick inorganic-material-based layer as described above. That is to say, the electron-injection layer 380 is formed so as to be more than 100 nm thick and to have conductivity in a range of $10^{-6}$ $\Omega^{-1}$ $cm^{-1}$ or more and 100 $\Omega^{-1}$ $cm^{-1}$ or less. Additionally, material for the electron-injection layer 380 is selected from the group consisting of zinc-tin-silicon-oxygen-based material, zinc-tin-oxygen-based material, and zinc-silicon-oxygen-based material.

It is obvious for a person skilled in the art that, similarly to the first light-emitting device 100 and the second light-emitting device 200, the risk for short-circuiting between two electrodes (i.e. the clear electrode 335 and the reflective electrode 370) may be significantly decreased because of such a configuration of the third light-emitting device 300. Furthermore, with respect to the third light-emitting device 300, it should be easily understood that existence of the thick inorganic-material-based layer (i.e. the electron-injection layer 380) is not associated with a possibility to negatively affect attributes of the third light-emitting device 300.

(Another Light-Emitting Device (3) According to the Embodiment of the Present Invention)

Figure 5:
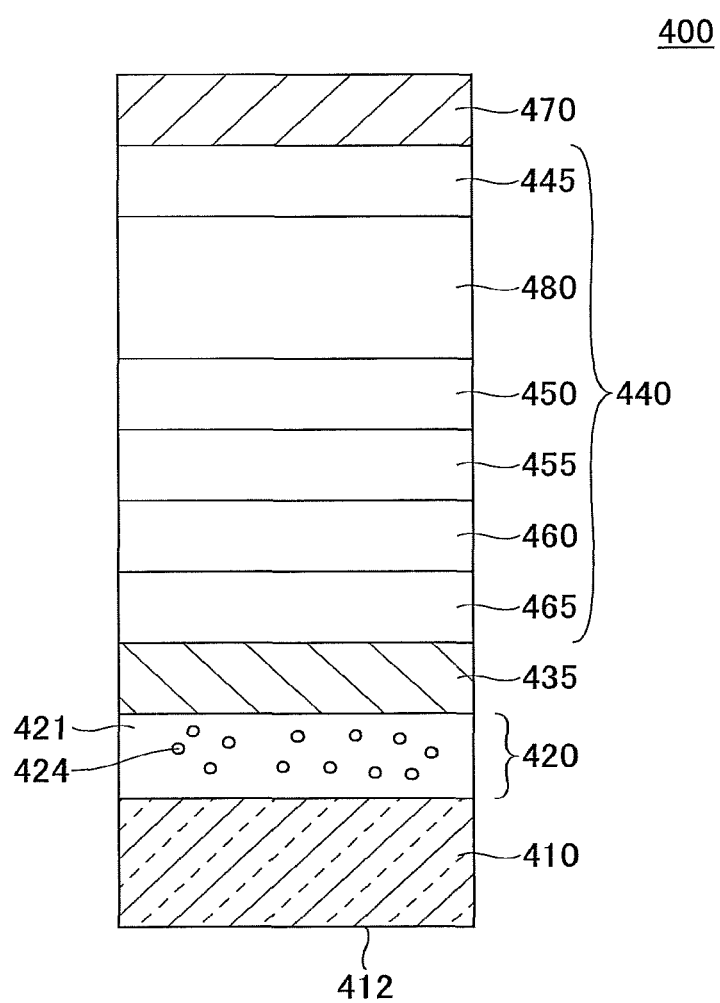
FIG. 5 is a drawing schematically illustrating a cross-section of another light-emitting device (3) according to an aspect of the present invention.

The following description explains a configuration of another light-emitting device (3) according to an aspect of the present invention, with reference to FIG. 5. FIG. 5 is a drawing schematically illustrating a cross-sectional configuration of said another light-emitting device (i.e. an organic LED element) 400 according to an aspect of the present invention.

As illustrated in FIG. 5, said another light-emitting device (which may be hereinafter referred to as a "fourth light-emitting device") 400 according to an aspect of the present invention basically has a similar configuration to the configuration of the third light-emitting device 300 illustrated in FIG. 4.

However, the fourth light-emitting device 400 is different from the third light-emitting device 300, in an aspect that an organic layer 440 includes both an electron-injection layer 445 and a thick inorganic-material-based layer 480. That is to say, the organic layer 440 of the fourth light-emitting device 400 includes layers laminated in an order as follows, starting from the layer closest to a clear electrode 435: a hole-injection layer 465, a hole-transport layer 460, an organic light-emitting layer 455, an electron-transport layer 450, a thick inorganic-material-based layer 480, and an electron-injection layer 445.

It is obvious for a person skilled in the art that, similarly to the first light-emitting device 100, the second light-emitting device 200, and the third light-emitting device 300, the risk for short-circuiting between two electrodes (i.e. a clear electrode 435 and a reflective electrode 470) may be significantly decreased because of such a configuration of the fourth light-emitting device 400. Furthermore, with respect to the fourth light-emitting device 400, it should be easily understood that existence of the thick inorganic-material-based layer 480 is not associated with a possibility to negatively affect attributes of the fourth light-emitting device 400.

(Regarding Each Constituent Member)

The following description explains each constituent member that constitutes the light-emitting device according to an aspect of the present invention.

The following description explains each constituent member, with reference to the second light-emitting device (i.e. organic LED element) 200 illustrated in FIG. 3, as an example. Therefore, in the following description, the reference symbols used in FIG. 3 are used to refer to each member for the purpose of clarification.

It should be noted that the following configuration of each constituent member is simply offered as an example.

(Clear Substrate 210)

There is no specific limitation regarding material for the clear substrate 210, as long as being transparent.

For example, the clear substrate 210 may be a glass substrate or a plastic substrate.

(Scattering Layer 220)

A scattering layer 220 includes a base material 221 and multiple scattering substances 224, which are dispersed inside the base material 221. The base material 221 has a first refractive index, and the multiple scattering substances 224 have a second refractive index that is different from the refractive index of the base material 221.

It is preferred that the amount of the scattering substances 224 inside the scattering layer 220 decreases with approaching outwards from the center, as in such a case highly efficient light-extraction may be performed.

The base material 221 is made of glass. Glass material may be inorganic glass such as soda-lime glass, borosilicate glass, or alkali-free glass.

The scattering substances 224 may be air-bubbles, precipitated crystals, material particles formed by material different from the base material 221, phase-separation glasses, etc. Phase-separation glasses are glasses constituted by two or more glass phases.

It is preferable that there is large difference between the refractive index of the base material 221 and the refractive index of the scattering substances 224. Therefore, it is preferable that the base material 221 is formed by a high refractive index glass and that the scattering substances 224 are formed by air-bubbles.

One or more materials for the high refractive index glass to be used for the base material 221 may be selected from among $P_2O_5$, $SiO_2$, $B_2O_3$, $GeO_2$, and $TeO_2$, as a network-former, and one or more materials for the high refractive index glass to be used for the base material 221 may be selected from among $TiO_2$, $Nb_2O_5$, $WO_3$, $Bi_2O_3$, $La_2O_3$, $Gd_2O_3$, $Y_2O_3$, $ZrO_2$, $ZnO$, $BaO$, $PbO$, and $Sb_2O_3$ as high refractive index material. Furthermore, for the purpose of adjusting attributes of glass, alkali oxide, alkaline earth oxide, fluoride, etc., may be added, to an extent of not negatively affecting the refractive index.

Color of light-emission may be changed by adding a coloring agent to the base material 221. The coloring agent may be transition metal oxide, rare earth metal oxide, metal colloid, or a combination of transition metal oxide, rare earth metal oxide, and metal colloid.

(Clear Electrode 235)

The clear electrode 235 is required to have translucency of more than 80%, so that light emitted by the organic light-emitting layer 255 is externally extracted. Furthermore, in a case where the clear electrode 235 is employed for an anode, the clear electrode 235 is required to have a high work-function, because of a high amount of hole-injection.

For example, material for the clear electrode 235 may be ITO, $SnO_2$, ZnO, indium-zinc-oxide (IZO), AZO (or ZnO—$Al_2O_3$; zinc oxide doped with aluminum), etc. Additionally, even in a case where the clear electrode 235 is employed for a cathode, an ohmic feature may be obtained with respect to the clear electrode 235 formed by the aforementioned material, as long as the electron-injection layer 245 is constituted by material selected from the group consisting of zinc-tin-silicon-oxygen-based material, zinc-tin-oxygen-based material, and zinc-silicon-oxygen-based material.

The clear electrode 235 is preferred to be more than 100 nm thick.

The refractive index of the clear electrode 235 may be in a range from 1.75 to 2.2. For example, in a case where ITO is utilized for the clear electrode 235, the refractive index of the clear electrode 235 may be decreased by increasing carrier concentration. Although commercially available ITO normally contains 10 wt % $SnO_2$, the refractive index of the ITO may be decreased by further increasing concentration of Sn. However, with respect to increasing concentration of Sn; although carrier concentration increases, rates of mobility and transmission decrease. Therefore, it is necessary that the amount of Sn is determined in consideration of the overall balance.

Additionally, it is preferable that the refractive index of the clear electrode 235 is determined, in consideration of the refractive indexes of the base material 221, which constitute the scattering layer 220, and the reflective electrode 270.

(Reflective Electrode 270)

For the reflective electrode 270, metal or metal alloy having a small work-function. For example, the reflective electrode 270 may be alkali metal, alkaline earth metal, metal of Group 3 of Periodic table, etc.

(Electron-Injection Layer 245)

In order to form the electron-injection layer 245, a layer doped with alkali metal such as lithium (Li) and cesium (Cs) is provided on a surface to the clear electrode 235, etc.

Note that, the thick inorganic-material-based layer 280 may be provided as the electron-injection layer 245, as described above.

(Thick Inorganic-Material-Based Layer 280)

As described above, material for the thick inorganic-material-based layer 280 may be selected from the group consisting of zinc-tin-silicon-oxygen-based material, zinc-tin-oxygen-based material, and zinc-silicon-oxygen-based material.

The thick inorganic-material-based layer 280 may be amorphous, and may have thickness of more than 100 nm and conductivity in a range of $10^{-6}$ $\Omega^{-1}$ $cm^{-1}$ or more and 100 $\Omega^{-1}$ $cm^{-1}$ or less.

The thick inorganic-material-based layer 280 may have thickness in a range from 100 nm to 500 nm. Furthermore, the thick inorganic-material-based layer 280 may have conductivity in a range of $10^{-4}$ $\Omega^{-1}$ $cm^{-1}$ or more and 10 $\Omega^{-1}$ $cm^{-1}$ or less.

For example, the thick inorganic-material-based layer 280 may be formed in a film-formation process such as a sputtering method and a physical vapor deposition (PVD) method.

(Electron-Transport Layer 250)

The electron-transport layer 250 transports electrons injected from the clear electrode 235. For example, the electron-transport layer 250 may be tris(8-quinolinolato) aluminum complex (Alq3), etc.

(Organic Light-Emitting Layer 255)

The organic light-emitting layer 255 functions as an area for injected electrons and holes to be recombined. Light-emitting material may be either low molecular-weight material or high molecular-weight material.

Guest material for the organic light-emitting layer 255 may be, for example, metal complex, which is quinoline derivative such as tris(8-quinolinolato)aluminum complex (Alq3) or bis(8-quinolinolato) calcium complex (Caq2), or may be fluorescent substances such as coronene.

Host material may be quinolinolato complex, and may be, more specifically, aluminum complex having 8-quinolinol and 8-quinolinol derivatives as ligands.

(Hole-Transport Layer 260)

The hole-transport layer 260 transports holes injected from the hole-injection layer 265 to the organic light-emitting layer 255.

For example, the hole-transport layer 260 may be formed by triphenylamine derivatives, etc.

Thickness of the hole-transport layer 260 may be, for example, in a range from 10 nm to 150 nm. Although the second light-emitting device 200 may be driven with lower electric voltage as the hole-transport layer 260 is thinner, the thickness is generally in a range from 10 nm to 150 nm, due to a risk for short-circuiting between electrodes.

(Hole-Injection Layer 265)

With respect to the hole-injection layer 265, it is preferable that difference in ionization potential is small, in order to lower a barrier against injection of holes from an electrode. With high efficiency of injecting charge from the electrode to the hole-injection layer 265, the second light-emitting device 200 is driven with lower electric voltage, which results in enhancement of hole-injection efficiency.

Material for the hole-injection layer 265 may be either high molecular-weight material or low molecular-weight material. Among high molecular-weight material, polyethylene dioxythiophene doped with polystyrene sulfonic acid (PSS) (i.e. PEDOT:PSS) is widely used. Among low molecular-weight material, phthalocyanine-based copper phthalocyanine (CuPc) is widely used.

Additional Effect

In the above description, the effect of the present invention is explained, with reference to the light-emitting device according to an aspect of the present invention. However, with respect to the light-emitting device according to an aspect of the present invention, an additional effect, which is to prevent color unevenness of light-emission, may be achieved when provided with a specific configuration.

Figure 6:
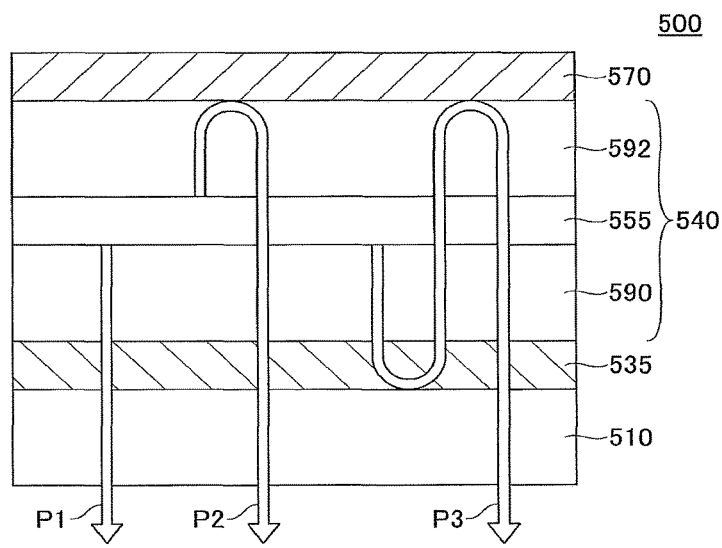
FIG. 6 is a schematic view for explaining a problem concerning color unevenness in a light-emitting device.

The following description explains such an effect, with reference to FIG. 6.

FIG. 6 is a drawing schematically illustrating a cross-section of a general light-emitting device 500 provided with a light-extraction structure.

As illustrated in FIG. 6, the light-emitting device 500 includes a clear substrate 510, a lower-part clear electrode 535, an organic layer 540, an upper-part reflective electrode 570, in the illustrated order. The organic layer 540 includes a light-emitting layer 555, constituent layers (e.g. an electron-injection layer and/or electron-transport layer, etc.; hereinafter referred to as a "first layer" 590 as a whole) disposed lower than the light-emitting layer 555 (i.e. disposed closer to the clear substrate 510), and constituent layers (e.g. a hole-transport layer and/or a hole-injection layer, etc.; hereinafter referred to as a "second layer" 592 as a whole) disposed higher than the light-emitting layer 555 (disposed closer to the upper-part reflective electrode 570).

Note that, although a light-extraction structure is not illustrated in FIG. 6 for the sake of simplicity, it is supposed that a light-extraction structure other than the scattering layer 120 as illustrated in FIG. 2 is provided.

When activating the light-emitting device 500 provided with the above-described configuration, electric potential is applied to the two electrodes (i.e. the lower-part clear electrode 535 and the upper-part reflective electrode 570), so that light is emitted by the light-emitting layer 555. The light is output (i.e. emitted) to the outside of the clear substrate 510 through at least three routes (i.e. routes P1, P2, and P3) as illustrated in FIG. 6.

It should be noted that the first layer 590 of the conventional light-emitting device 500 is relatively thin, and therefore variation in film-thickness of the first layer 590 does not prominently affect the distance between the lower-part clear electrode 535 and the light-emitting layer 555. Similarly, the second layer 592 is relatively thin, and therefore variation in film-thickness of the second layer 592 does not prominently affect the distance between the upper-part reflective electrode 570 and the light-emitting layer 555. Thus, interference condition of light barely changes with respect to the three routes P1 through P3 illustrated in FIG. 6, and therefore color unevenness of output light barely occurs.

However, in a case of having a thick layer (e.g. the aforementioned "thick inorganic-material-based layer") inside the first layer 590, variation in film-thickness depending on location in the first layer 590 becomes relatively larger.

Especially, with respect to the route P3, the number of times for light to pass through the first layer 590 is tripled, compared to the routes P1 and P2, and therefore the route 3 is affected more significantly by influence of variation in film-thickness. That is to say, interference conditions of light with respect to the routes P1 and P2 are different from that of the route P3. Therefore, differences in color of output light-emission become more significant, which results in color unevenness with respect to the light-emitting device 500.

Contrarily, in a case of providing, for example, the scattering layer 120 illustrated in FIG. 2, etc., in a light-extraction structure, the aforementioned problem may be significantly prevented.

The above effect is obtainable because it is possible to design the scattering layer 120 so as to have a refractive index relatively close to the refractive index of the lower-part clear electrode 535. That is to say, in a case where the scattering layer 120 is provided, difference of the refractive indexes may be reduced with respect to the interfacial surface of the scattering layer 120 and the lower-part clear electrode 535, so that the amount of light re-reflected at the interfacial surface of the scattering layer 120 and the lower-part clear electrode 535 is reduced. As a result, the amount of light-emission output through the route P3 is reduced, and therefore such a problem concerning color unevenness is significantly prevented.

To confirm such an interference-inhibiting effect derived from such a scattering layer with a high refractive index, comparison was performed with respect to features regarding light-emission, by means of simulated calculation, comparing a case (i.e. Case 1) of having a scattering layer and a case (i.e. Case 2) of not having a scattering layer. Although such a scattering layer includes scattering particles, for the purpose of confirming the interference-inhibiting effect, it is sufficient to assume a layer constituted only by the matrix component and without limits in film-thickness.

For Case 1, the following assumption is provided regarding the configuration of a light-emitting device.

(Case 1)
  Clear substrate with A scattering layer: refractive index of the matrix component of the scattering layer=1.9
  Lower-part clear electrode: thickness=150 nm; refractive index=1.9
  Electron-ejection layer (assumed to be formed as a thick inorganic-material-based layer): thickness=450 to 550 nm (presumed to have variation in film-thickness of ±10%); refractive index=1.8
  Light-emitting layer: thickness=10 nm; refractive index=1.75
  Hole-transport layer: thickness=50 nm; refractive index=1.8
  Upper-part reflective electrode: thickness=80 nm; refractive index=0.6; extinction coefficient=3.55

Furthermore, for Case 2, an assumption similar to Case 1, except for not having a scattering layer, is provided regarding the configuration of the light-emitting device, as described below.

(Case 2) (not Having a Scattering Layer)
  Clear substrate: refractive index=1.5
  Other aspects of the configuration are the same as Case 1

In the two above-described cases, front brightness of light-emission obtained from the light-emitting devices according to the above assumptions ware calculated, by means of software "setfos" (product of FLUXiM)

Figure 7:
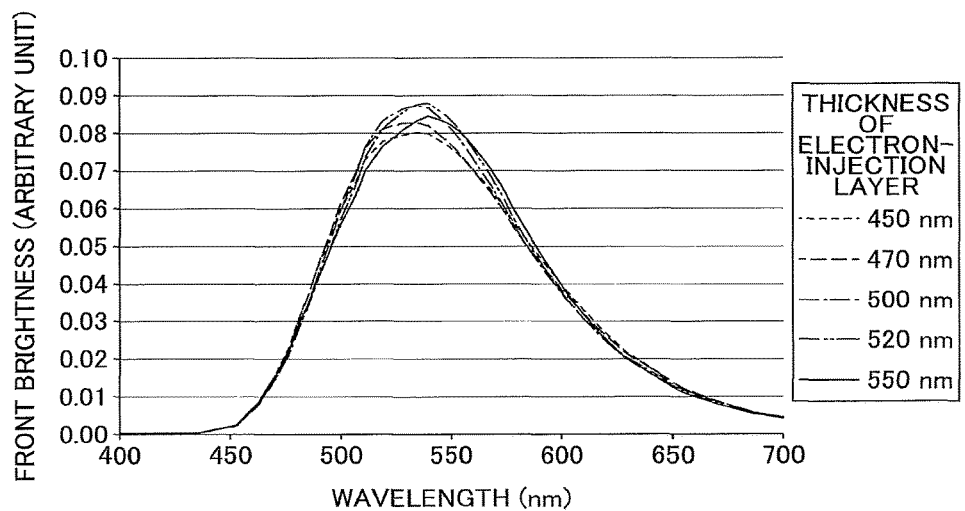
FIG. 7 is a graph illustrating a calculation result of front brightness of a light-emitting device having a scattering layer.
Figure 8:
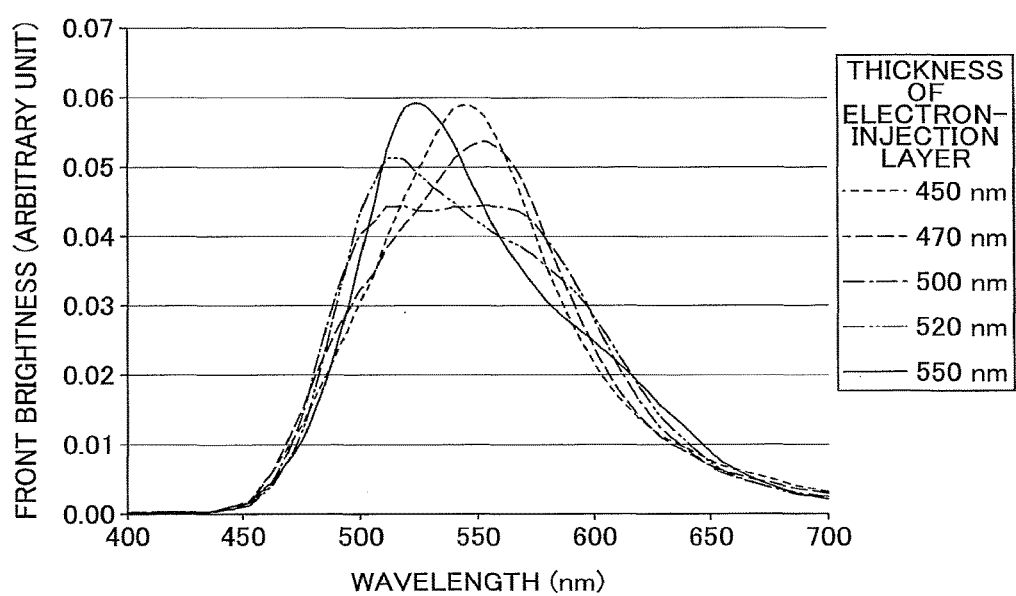
FIG. 8 is a graph illustrating a calculation result of front brightness of a light-emitting device not having a scattering layer.

A calculation result is shown in FIGS. 7 and 8. A calculation result in Case 1 is shown in FIG. 7, and a calculation result in Case 2 is shown in FIG. 8. Further, in both of FIGS. 7 and 8, a spectrum of wavelength of output light is indicated on the horizontal axes, and front brightness is indicated on the vertical axes.

As illustrated in FIG. 8, in Case 2, brightness of output light significantly changes, depending on thickness of the electron-injection layer formed as a thick inorganic-material-based layer, which varies in a range from 450 to 550 nm. Contrarily, in Case 1, brightness of output light barely changes, regardless of thickness of the electron-injection layer formed as a thick inorganic-material-based layer, which varies in a range from 450 to 550 nm.

As described above, with respect to such a light-emitting device provided with a scattering layer as a light-extraction structure, it is confirmed that, even though a thick inorganic-material-based layer is disposed between the lower-part clear electrode 535 and the light-emitting layer 555, there is not a significant change in interference conditions, and therefore color unevenness barely occurs.

(Method for Manufacturing the Light-Emitting Device According to an Aspect of the Present Invention)

Figure 9:
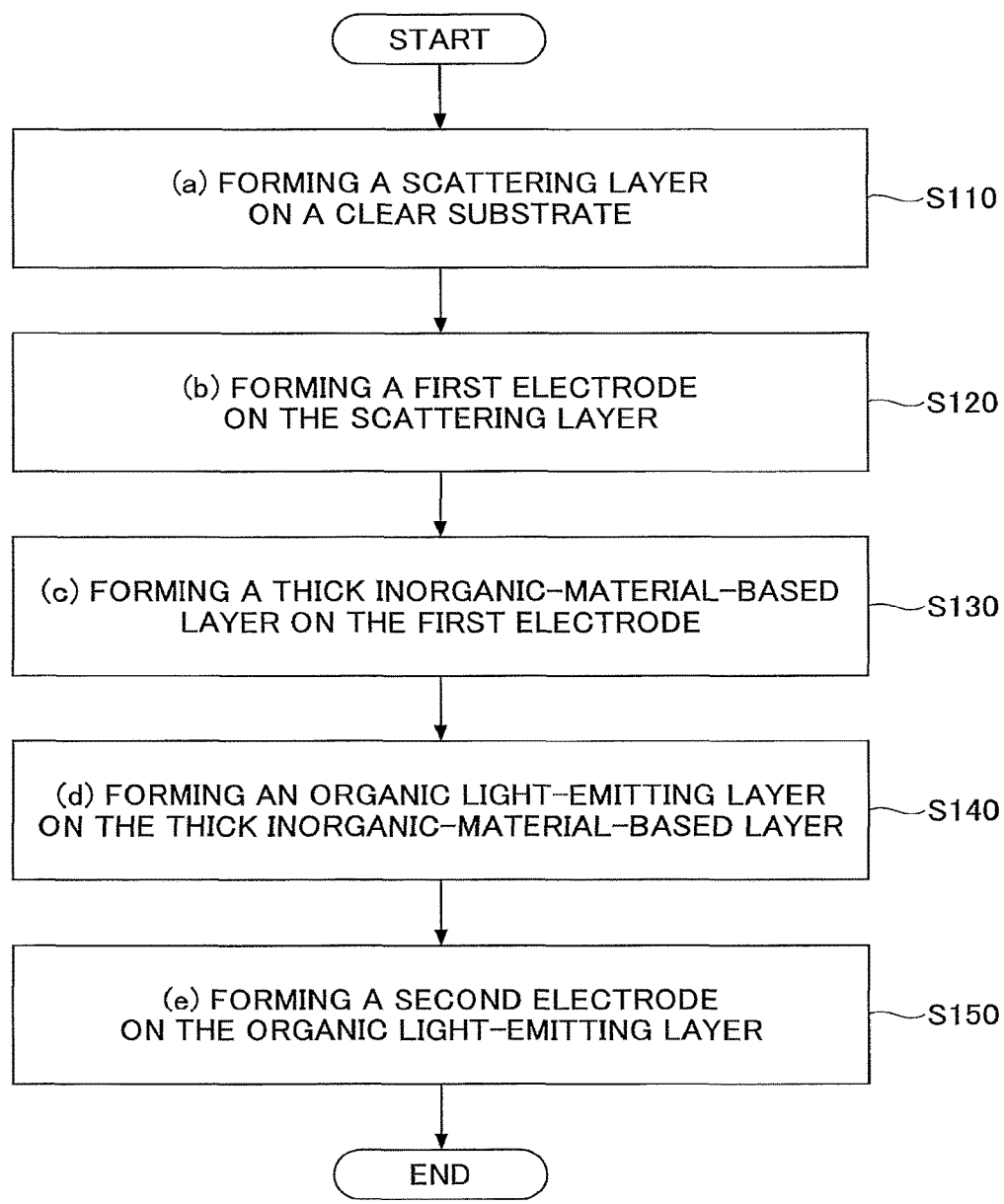
FIG. 9 is a diagram schematically illustrating an overall flow of manufacturing a first light-emitting device.

The following description explains an example of a method for manufacturing the light-emitting device according to an aspect of the present invention, with reference to FIG. 9. Here, a manufacturing method is explained, taking the first light-emitting device 100 having the configuration illustrated in FIG. 2 as an example. However, it should be obvious for a person skilled in the art that the manufacturing method as described below may be partly modified so as to be applied to a light-emitting device having other configuration such as the second light-emitting device 200, the third light-emitting device 300, and the fourth light-emitting device 400, as illustrated in FIGS. 3 through 5.

FIG. 9 is a diagram illustrating a schematic flow of manufacturing the first light-emitting device 100.

As illustrated in FIG. 9, the manufacturing method includes:
(a) a step for forming a scattering layer on a clear substrate (Step S110);
(b) a step for forming a first electrode on the scattering layer (Step S120);
(c) a step for forming a thick inorganic-material-based layer on the first electrode (Step S130)
(d) a step for forming an organic light-emitting layer on the thick inorganic-material-based layer (Step S140); and
(e) a step for forming a second electrode on the organic light-emitting layer (Step S150).

The following description explains each of the steps. In the following explanation, the reference symbols used in FIG. 2 are used to refer to each member, for the purpose of clarification.

(Step S110)

First, the clear substrate 110 is prepared.

Next, the scattering layer 120, which has scattering substances 124 dispersed inside the base material 121 made of glass, is formed on the clear substrate 110.

There is no specific limitation regarding the method for forming the scattering layer 120, although the following description explains the method for forming the scattering layer 120 specifically in a "frit-paste method". However, it should be obvious for a person skilled in the art that the scattering layer 120 may also be formed in other methods.

In a frit-paste method, paste consisting of glass material, which is called frit-paste, is prepared (i.e. a preparation process). Then, the frit-paste is applied to a surface of a base substrate, so as to develop a pattern (i.e. a pattern-developing process). The frit-paste is then fired (i.e. a firing process), such that a desired glass film is formed on the base substrate.

The following description briefly explains each of the processes.

(Preparation Process)

First, frit-paste, which consists of fritted glass, resin, solvent, etc., is prepared.

The fritted glass is constituted by material to be used to form a base material of the scattering layer. There is no specific limitation regarding composition of the fritted glass, as long as being suitable for obtaining a desired scattering attribute, for forming into frit-paste, and for performing the firing process. Composition of the fritted glass may be, for example, 20 to 30 mol % of $P_2O_5$, 3 to 14 mol % of $B_2O_3$, 10 to 20 mol % of $Bi_2O_3$, 3 to 15 mol % $TiO_2$, 10 to 20 mol % of $Nb_2O_5$, 5 to 15 mol % of $WO_3$, and 10 to 20 mol % of the total amount of $Li_2O$, $Na_2O$ and $K_2O$, in which the total amount of the above material is more than 90 mol %. The particle diameter of the fritted glass may be, for example, in a range from 1 to 100 μm.

It should be noted that a predetermined amount of filler may be added to the fritted glass, in order to control a thermal expansion attribute of the obtained scattering layer 120. Filler may be, for example, zircon, silica, or alumina particles, which normally have particle diameters in ranges of 0.1 to 20 μm.

Resin may be, for example, ethyl cellulose, butyral resin, melamine resin, alkyd resin, and rosin resin. Note that, by adding butyral resin, melamine resin, alkyd resin, or rosin resin, strength of a frit-paste-applied film is enhanced.

Solvent is used for dissolving resin and for adjusting viscosity. Solvent may be, for example, α-terpineol or 2,2,4-trimethyl-1,3-pentanediol monoisobutyrate.

Furthermore, a surface-activating agent may be added to the frit-paste, for adjusting viscosity and for promoting dispersion of frit. Further, a silane coupling agent may be used for surface modification.

Then, the above material is mixed, so as to uniformly disperse material for glass, for preparation of frit-paste.

(Pattern-Developing Process)

Then, the frit-paste prepared in the above-described method is applied to a clear substrate, so as to develop a pattern. There is no specific limitation regarding methods for application of frit-paste and for developing patterns. For example, pattern printing of frit-paste may be performed on a clear substrate, by use of a screen printer. Furthermore, a doctor-blade printing-method or a die-coating printing-method may be utilized.

Then, the frit-paste film is dried out.

(Firing Process)

Then, the frit-paste film is fired. Commonly, the firing process is performed through two steps. At the first step, resin of the frit-paste film is discomposed and disappeared, and at the second step, the fretted glass is softened and sintered.

To implement the first step, the frit-paste film is kept under an atmosphere filled with air at a temperature range of 200 to 400° C. However, the process temperature may be changed in accordance with resin material contained in the frit-paste. For example, in a case of using ethyl cellulose resin, the process temperature may be approximately from 350 to 400° C. In a case of using nitrocellulose resin, the process temperature may be approximately from 200 to 300° C. Further, the process time is approximately from 30 minutes to an hour, in general.

To implement the second step, the frit-paste film is kept under an atmosphere filled with air at a temperature range of ±30° C. of the softening temperature of the contained fritted glass. The process temperature may be, for example, in a range from 450 to 600° C. Further, the process time may be, for example, in a range from 30 minutes to an hour, although there is no specific limitation regarding the process time.

Through the second step, the fritted glass is softened and sintered, so that the base material 121 of the scattering layer 120 is formed. Furthermore, by causing scattering substances, such as air-bubbles, to be contained inside the frit-paste film, the scattering substances 124 that are uniformly dispersed inside the base material 121 may be obtained.

Then, the clear substrate 110 is cooled down, so as to form the scattering layer 120 having side surfaces declining from the top surface to the bottom surface at a more gradual approach than a right angle.

Thickness of the obtained scattering layer 120 may be in a range from 5 to 50 μm.

(Step S120)

Then, the clear electrode 135 (hereinafter referred as a first electrode 135) is formed on the scattering layer 120, which is obtained in the previous step.

There is no specific limitation regarding methods for disposing the first electrode 135. For example, a film-forming method such as a sputtering method, an evaporation method, or a vapor-deposition method may be employed.

As described above, material for the first electrode 135 may be ITO, etc. Furthermore, thickness of the first electrode 135 may be, for example, in a range from 50 nm to 1.0 μm, although there is no specific limitation regarding thickness of the first electrode 135.

Furthermore, the pattern of the first electrode 135 may be developed through an etching process, etc.

(Step S130)

Then, the electron-injection layer 180 (hereinafter referred to as a thick inorganic-material-based layer 180) is formed on the first electrode 135.

The thick inorganic-material-based layer 180 may be formed in a process using, for example, a sputtering method, a PVD method, etc.

As described above, material for the thick inorganic-material-based layer 180 may be selected among a group of zinc-tin-silicon-oxygen-based material, zinc-tin-oxygen-based material, and zinc-silicon-oxygen-based material.

Additionally, the thick inorganic-material-based layer 180 may have thickness of more than 100 nm and conductivity in a range of $10^{-6}$ $\Omega^{-1}$ $cm^{-1}$ or more and 100 $\Omega^{-1}$ $cm^{-1}$ or less.

The thick inorganic-material-based layer 180 planarizes the outermost surface. Thus, even though an extraneous substance remains on a surface after forming the scattering layer 120, flatness of layers disposed after Step S130 may be enhanced, which enables significantly decreasing a risk for short-circuiting between the first electrode 135 formed at Step S120 and a second electrode 170 to be formed at following Step S150.

(Step S140)

Then, each layer that constitutes the organic layer 140 is formed on the thick inorganic-material-based layer 180.

Note that, in the example of FIG. 2, the organic layer 140 includes the electron-transport layer 150, the organic light-emitting layer 155, the hole-transport layer 160, and the hole-injection layer 165.

However, the organic layer 140 need not necessarily include all of the aforementioned layers. That is to say, layers, except for the organic light-emitting layer 155, may be omitted.

There is no specific limitation regarding methods for disposing each of the layers constituting the organic layer 140. For example, an evaporation method and/or a coating method may be employed.

(Step S150)

Then, the reflective electrode 170 (hereinafter referred to as the second electrode 170) is formed on the organic layer 140.

There is no specific limitation regarding methods for disposing the second electrode 170. For example, an evaporation method, a sputtering method, or a vapor-deposition method may be employed.

Through the above steps, the first light-emitting device 100 as illustrated in FIG. 2 is manufactured.

As described above, according to the method for manufacturing the first light-emitting device 100, the risk for short-circuiting between the first electrode 135 and the second electrode 170 may be significantly decreased, because the thick inorganic-material-based layer 180 is disposed at Step S130.

Furthermore, because the thick inorganic-material-based layer 180 has the aforementioned attributes, even though the thick inorganic-material-based layer 180 is formed between the electrodes, negative affect on attributes of the first light-emitting device 100 may be inhibited.

EMBODIMENTS

The following description explains embodiments of the light-emitting device according to the present invention.

Example 1

A sample having an inorganic-material-based film formed on each of various base substrates is prepared in a method as described below. A nickel substrate, a glass substrate, etc., are employed as the base substrates.

(Condition for Film-Formation)

Radio-frequency (RF) magnetron sputtering equipment (product of ULVAC, Inc.) is utilized as a film-forming apparatus. A sintered object with a diameter of 2 inches containing ZnO and SiO$_2$ at a predetermined ratio is utilized as a sputtering target.

To perform film-formation, a base substrate is introduced into a chamber of the sputtering apparatus.

Vacuum inside the chamber of the sputtering apparatus is adjusted to be 10$^{-5}$ Pa or less, and then 20 sccm of predetermined sputtering gas is introduced into the chamber. Argon (Ar) gas (G1 grade; 99.99995 vol. % pure) or mixed gas of oxygen (O$_2$) gas (G1 grade; 99.99995 vol. % pure) and Ar gas (G1 grade) is used as sputtering gas. In other words, Ar gas or O$_2$/Ar mixed gas with oxygen concentration of 20% is used as sputtering gas.

Pressure of sputtering gas and distance (i.e. T-S distance) between the target and the base substrate are predetermined, and then electric power of 50 W is applied to the cathode of the sputtering apparatus. Temperature of the substrate at the time of film-formation is 70° C. or less.

Examples 2 Through 9

Samples having inorganic-material-based films formed on various base substrates are prepared in a method similar to Example 1, although a different condition for film-formation is provided in each of Examples 2 through 9, compared to Example 1.

All conditions for film-formation provided in Examples 1 through 9 are shown in Table 1 below.

TABLE 1

| EX-AMPLE | COMPOSITION OF TARGET (mol %) ZnO/SiO$_2$ | GAS PRESSURE (Pa) | OXYGEN CONCEN-TRATION (%) | T-S DISTANCE (cm) |
|---|---|---|---|---|
| 1 | 85/15 | 0.3 | 20 | 5 |
| 2 | 90/10 | 0.3 | 0 | 11 |
| 3 | 90/10 | 1.0 | 0 | 11 |
| 4 | 90/10 | 0.3 | 0 | 6.5 |
| 5 | 90/10 | 1.0 | 0 | 6.5 |
| 6 | 90/10 | 0.3 | 20 | 6.5 |
| 7 | 95/5 | 0.3 | 0 | 5 |
| 8 | 97/3 | 0.3 | 0 | 6.5 |
| 9 | 97/3 | 0.3 | 20 | 6.5 |

The following assessment was conducted, based on each of the samples obtained in Examples 1 through 9.

(Assessment 1: Atomic Fraction)

Assessment was conducted regarding an atomic fraction (Zn/(Zn+Si)) of the inorganic-material-based film, using each of the samples obtained in Examples 1 through 9. Here, with respect to each of the samples, the base substrate is a nickel substrate.

The atomic fraction was calculated by performing Scanning Electron Microscope/Energy Dispersive X-ray Spectroscopy (SEM-EDX) analysis on the inorganic-material-based film. Accelerating voltage was set to 10 kV, in order to reduce influence caused by using a nickel substrate.

All obtained results are shown in the "Zn/(Zn+Si)" section of Table 2 below.

TABLE 2

| EXAMPLE | Zn/(Zn + Si) | SCHERRER DIAMETER (nm) | STATE | BANDGAP (eV) | ELECTRON-AFFINITY (eV) | RESISTIVITY (Ωcm) |
|---|---|---|---|---|---|---|
| 1 | 0.76 | 1.2 | AMORPHOUS | 4.0 | 2.6 | — |
| 2 | 0.88 | 1.1 | AMORPHOUS | 3.3 | 3.3 | 1.8 |
| 3 | 0.91 | 2.3 | AMORPHOUS | 3.3 | 3.3 | 5.2 × 10$^{-2}$ |
| 4 | 0.86 | 1.4 | AMORPHOUS | 3.3 | 3.3 | 4.1 |
| 5 | 0.89 | 1.3 | AMORPHOUS | 3.3 | 3.3 | 1.3 × 10$^{-1}$ |
| 6 | 0.88 | 2.2 | AMORPHOUS | 3.3 | 3.3 | 9.8 × 10$^3$ |
| 7 | 0.94 | 4.2 | AMORPHOUS | 3.2 | 3.4 | 75 |
| 8 | 0.96 | 7.0 | CRYSTALLINE | — | — | — |
| 9 | 0.96 | 8.4 | CRYSTALLINE | — | — | — |

(Assessment 2: X-Ray Diffraction)

X-Ray diffraction spectrum with respect to the inorganic-material-based film was measured, using each of the samples obtained in Examples 1 through 9. Here, with respect to each of the samples, the base substrate is a 1 mm thick silica glass substrate.

An X-Ray diffraction spectrum was measured in Seemann-Bohlin method, by use of X-ray diffraction equipment RINT-2000 (product of Rigaku Corporation). Details of Seemann-Bohlin method are explained in Journal of the Japan Institute of Metals and Materials Vol. 27 (1988) No. 6, pp. 461-465. Observation of a diffraction pattern was performed by irradiating Cu with an electron beam in a condition where accelerating voltage was 50 kV and discharging current was 300 mA, and by irradiating each of the samples with a generated CuKα beam at a fixed incidence angle of 0.5°.

Figure 10:
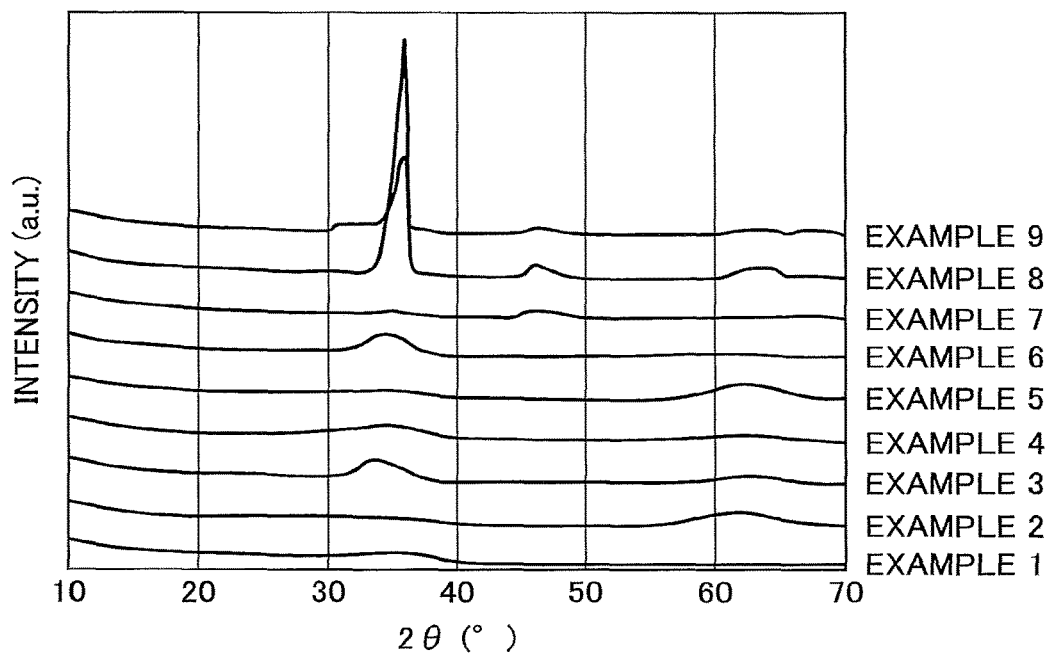
FIG. 10 is a drawing illustrating X-ray diffraction spectrums with respect to samples in Examples 1 through 9.

Diffraction patterns obtained by use of each of the samples are shown in FIG. 10.

In each of the diffraction patters, a halo pattern, which is caused by wurtzitic ZnO, was observed. Scherrer diameters with respect to face (002) of wurtzitic ZnO near the diffraction angle 2θ of 33° are shown in the "SCHERRER DIAMETER" section of Table 2 above.

All of Scherrer diameters with respect to the films obtained in Examples 1 through 7 are 5 nm or less, and therefore it is confirmed that the films are in amorphous or primarily amorphous states, according to the X-ray diffraction. Contrarily, Scherrer diameters with respect to the films obtained in Examples 8 and 9 are more than 5 nm, and therefore it is confirmed that the films are in crystalline states, according to the X-ray diffraction.

(Assessment 3: UPS Measurement)

Ionization potential was measured in an ultraviolet photoelectron spectroscopy (UPS) method, using each of the samples obtained in Examples 1 through 9.

Note that, with respect to each of the samples, the base substrate (hereinafter referred to as an ITO substrate) includes ITO formed on an alkaline-free glass substrate in thickness of 150 nm. Furthermore, the inorganic-material-based film (in thickness of 10 nm) is formed on the surface formed by ITO of the ITO substrate.

The measurement was conducted by irradiating the film with ultraviolet rays emitted by an He lamp (He(I); 21.22 eV), under high vacuum of $10^{-7}$ Pa.

Figure 11:
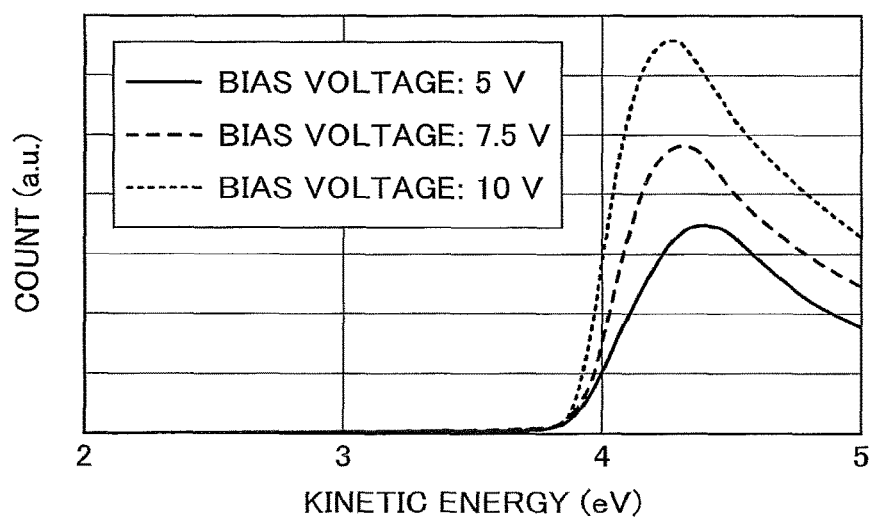
FIG. 11 is a drawing illustrating a UPS spectrum (i.e. work-function) with respect to the sample in Example 1.
Figure 12:
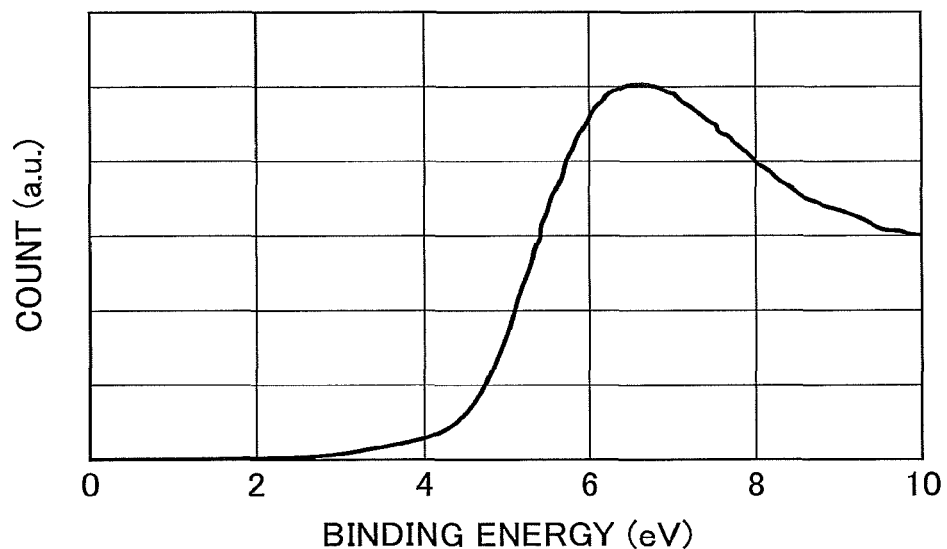
FIG. 12 is a drawing illustrating a UPS spectrum (i.e. ionization potential) with respect to the sample in Example 1.

Results obtained from the sample in Example 1 are shown in FIGS. 11 and 12. FIG. 11 is a drawing illustrating a relation between the counted number of photoelectrons and kinetic energy of the photoelectrons. FIG. 12 is a drawing illustrating a relation between the counted number of photoelectrons and binding energy.

According to FIG. 11, work-function of the thin film formed on the sample in Example 1 was calculated to be 3.9 eV. Furthermore, according to FIG. 12, ionization potential of the thin film formed on the sample in Example 1, which is determined by adding bonding energy and work-function, was calculated to be 6.6 eV.

(Assessment 4: Light-Absorption Coefficient)

Light-absorption coefficient of each of the inorganic-material-based film was calculated, using each of the samples obtained in Examples 1 through 9. Here, with respect to each of the samples, the base substrate is a 1 mm thick silica glass substrate.

Calculation of light-absorption coefficient was conducted by measuring reflectance and transmission, using each of the samples. Furthermore, an optical bandgap was calculated, based on an obtained Tauc plot with respect to the light-absorption coefficient.

Figure 13:
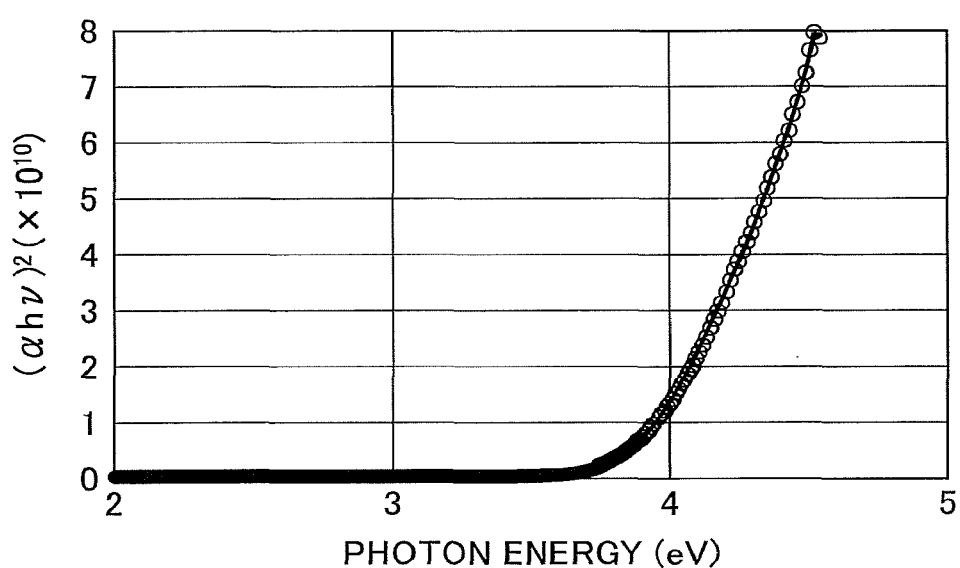
FIG. 13 is a drawing illustrating a Tauc plot of an inorganic-material-based film with respect to the sample in Example 1.
Figure 14:
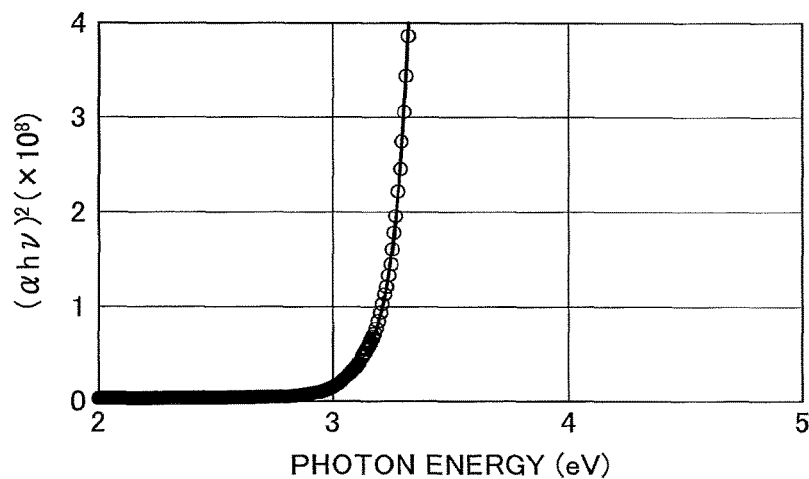
FIG. 14 is a drawing illustrating a Tauc plot of an inorganic-material-based film with respect to the sample in Example 2.

FIGS. 13 and 14 are drawings illustrating Tauc plots with respect to the inorganic-material-based films formed on the samples in Examples 1 and 2.

All of optical bandgaps obtained from the samples are shown on the "BANDGAP" section of Table 2 above. Optical bandgaps with regard to the samples in Examples 1 through 7 are in a range from 3.2 to 4.0.

Referring to the results regarding the ionization potential, which is obtained in the UPS measurement, the electron-affinity of the inorganic-material-based film formed on the sample in Example 1 is expected to be 2.6 eV. Based on an assumption that the inorganic-material-based films formed on the samples in Examples 2 through 7 have similar amounts of ionization potential, the electron-affinities of the inorganic-material-based films formed on the samples in Examples 2 through 7 are expected to be approximately from 3.3 to 3.4 eV.

All of electron-affinities expected with regard to the inorganic-material-based films formed on each of the samples are shown on the "ELECTRON-AFFINITY" section of Table 2 above.

(Assessment 5: Resistivity)

Resistivity of the inorganic-material-based film was measured, using each of the samples obtained in Examples 2 through 7. With respect to each of the samples, the base substrate was a 1 mm thick silica glass substrate.

Resistivity was measured in a four-terminal method. Measurement electrodes were 1-mm-wide Nd-containing Al layers formed, by means of a sputtering method, on the inorganic-material-based film of each of the samples at an interval of 2 mm.

2-mol %-Nd-containing Al (product of Kobelco Research Institute, Inc.; product name: AD20) with a diameter of 2 inches was employed for a target of sputtering film-formation.

All of the obtained measurement results are shown on the "RESISTIVITY" section of Table 2 above.

(Assessment 6: Assessment on Electron-Transport Performance)

A device that conducts only electrons, a so-called electron-only device, was manufactured in the following method, and then assessment was conducted with respect to the device.

The electron-only device includes a cathode (i.e. a bottom electrode) disposed on a glass substrate, an electron-transport layer having thickness of 150 nm disposed on the bottom electrode, and an anode (i.e. a top electrode) disposed on the electron-transport layer so that the top electrode makes a right angle with the bottom electrode.

To form the cathode, sputtering film-formation was performed, using a target of 2-mol %-Nd-containing Al (product of Kobelco Research Institute, Inc.; product name: AD20) with a diameter of 2 inches, so as to obtain 80-nm-thick and 1-mm-wide Nd-containing Al. As the electron-transport layer, a 150-nm-thick Alq3 layer was formed. As the anode, an 80-nm-thick Alq3 layer was formed in a vacuum evaporation method.

Electric voltage was applied to the anode and the cathode of the electron-only device, in order to measure a value of generated electric current.

Figure 15:
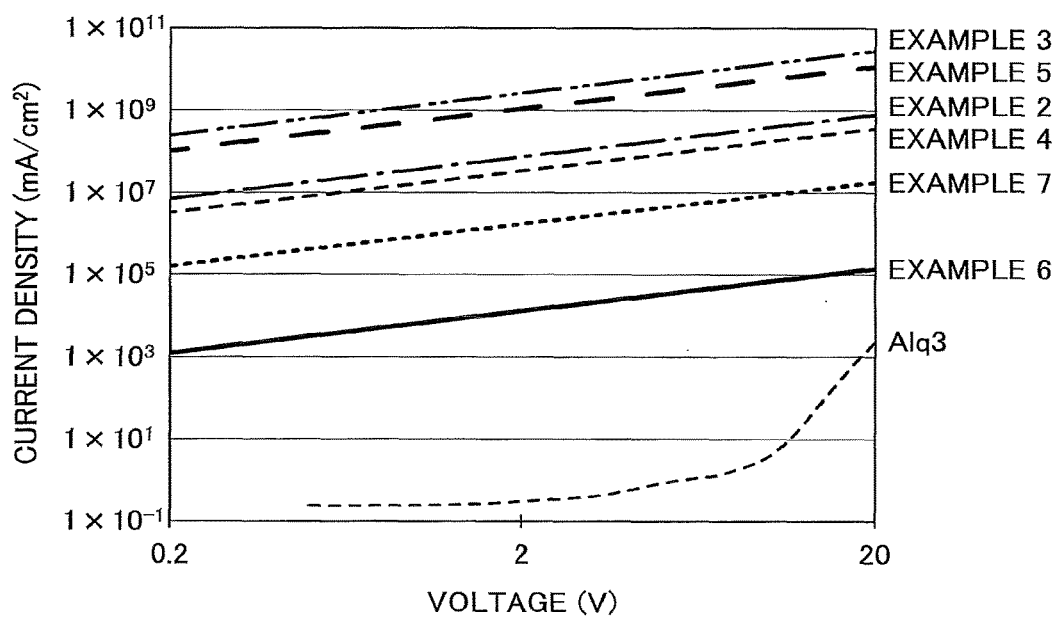
FIG. 15 is a drawing illustrating current-voltage attributes obtained with respect to an electron-only device and the samples in Examples 2 through 7.

In FIG. 15, a current-voltage attribute (referred to as "Alq3") obtained with respect to the electron-only device is illustrated.

Note that, in FIG. 15, current-voltage attributes with respect to the samples in Examples 2 through 7 are illustrated along with the current-voltage attribute with respect to Alq3. The current-voltage attributes were calculated, based on the resistivity of each of the samples.

The following Equation 1 was employed for the calculation:

$$I/A = E/(\rho \cdot L) \qquad \text{Equation 1}$$

Here, I is current density, A is area, E is electric voltage, $\rho$ is resistivity, and L is thickness of the electron-transport layer. The thickness of the electron-transport layer was determined to be 150 nm.

As illustrated in FIG. 15, in a range of applied electric voltage up to 20 V, values of electric current with respect to the samples obtained in Examples 2 through 7 are a few orders of magnitudes greater than that of the electron-only device provided with the electron-transport layer formed by Alq3. Note that, in FIG. 15, electric voltage region of more than 20 V is not illustrated, because such a great amount of electric voltage is impracticable, causing for deterioration of elements (or devices).

According to FIG. 15, it is confirmed that, in a case where the inorganic-material-based films of the samples in Examples 2 through 7 are employed for the electron-transportation layers, sufficient electron-transportation performances to be used for an organic EL element may be obtained, even for a film-thickness of 150 nm.

Example 10

An organic EL element was manufactured in the following method, and then assessment was conducted with respect to attributes of the organic EL element. The organic EL element includes a cathode (i.e. a bottom electrode) disposed on a glass substrate, and includes layers laminated on the cathode in an order as follows: an electron-transport layer, a light-emitting layer, a hole-transport layer, a hole-ejection layer, and an anode (i.e. a top electrode). The organic EL element was configured to extract light from the surface by the anode. Furthermore, in Example 10, formation of the electron-ejection layer, a hole-blocking layer, and an electron-blocking layer were omitted.

First, the cathode was formed on the glass substrate. For the glass substrate, alkali-free glass was employed. A cleaned glass substrate and a metal mask were placed in a chamber of the sputtering apparatus. Furthermore, a target for forming the cathode was placed in the chamber of the sputtering apparatus. For the target for forming the cathode, 2-mol %-Nd-containing Al (product of Kobelco Research Institute, Inc.; product name: AD20) with a diameter of 2 inches was employed. Sputtering film-formation was performed so as to form an 80-nm-thick and a 1-mm-wide cathode on the glass substrate, by use of the metal mask. Sputtering gas was Ar under pressure of 0.3 Pa. Electric power of 50 W was applied to a cathode for sputtering.

Next, the electron-transport layer was formed on the cathode. Without moving the metal mask, the inorganic-material-based film having thickness of 100 nm was formed as an electron-transport layer, on the cathode of the glass substrate, in the same sputtering condition as Example 7.

Then, on the electron-transport layer, the light-emitting layer, the hole-transport layer, and the hole-injection layer were formed. The glass substrate provided with the electron-transport layer (and the cathode) was conveyed from the chamber of the sputtering apparatus to a chamber for performing vacuum deposition, under a high vacuum atmosphere of $10^{-4}$ Pa or less. Then, Alq3 was deposited on the electron-transport layer so as to be 50 nm thick, to form the light-emitting layer. Then, α-NPD was deposited on the light-emitting layer so as to be 50 nm thick, to form the hole-transport layer. Then, MoOx was deposited on the hole-transport layer so as to be 0.8 nm thick, to form the hole-ejection layer.

Then, the anode was formed on the hole-ejection layer. Au is deposited on the hole-ejection layer of the glass substrate so as to have thickness of 10 nm and width of 1 mm, to form the anode. Vacuum at the time of performing deposition was approximately $8 \times 10^{-6}$ Pa. As the anode transmits visible light, light is extracted through the surface by the anode (i.e. the top electrode).

Note that the light-emitting layer, the hole-transport layer, and the hole-ejection layer were formed by use of a metal mask, so that the cathode and the electron-transport layer were completely covered. The anode is formed by use of a metal mask, so that the anode is oriented orthogonally with respect to the cathode. The region of 1 mm×1 mm, where the 1-mm-wide anode overlaps above the 1-mm-wide cathode, is a region to emit light in response to application of electric voltage.

Through the above steps, the organic EL element, including the glass substrate, the cathode formed by 2-mol %-Nd-containing Al, the electron-transport layer formed by the inorganic-material-based film, the light-emitting layer formed by Alq3, the hole-transport layer formed by α-NPD, a hole-ejection layer formed by $MoO_x$, and the anode formed by Au, was manufactured.

(Assessment of the Organic EL Element)

Next, with respect to the manufactured organic EL element, current and brightness corresponding to application of direct-current voltage were measured. The measurement was conducted by measuring brightness and current values responding to application of a predetermined value of electric voltage to between the anode and the cathode of the organic EL element inside a nitrogen-purged glove box. For the brightness measurement, a luminance meter (BM-7A; product of TOPCON CORPORATION) was employed.

Figure 16:
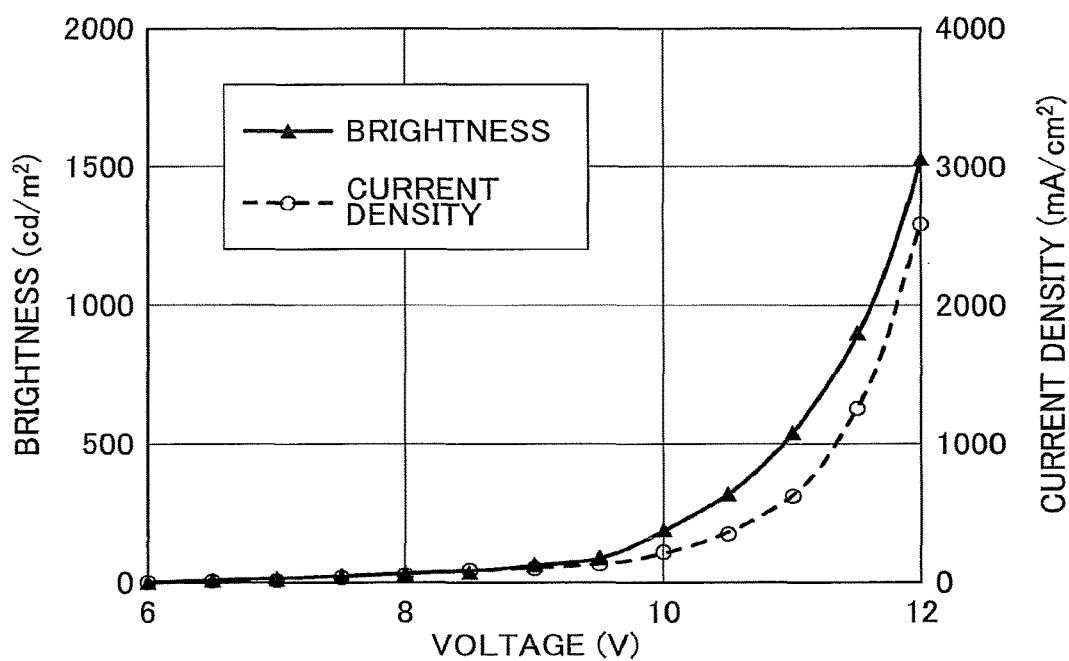
FIG. 16 is a drawing illustrating a current-voltage-brightness attribute measured with respect to an organic EL element in Example 10.

In FIG. 16, current-voltage-brightness attributes measured with respect to the organic EL element are illustrated. Brightness and current density of the organic EL element increased as the electric voltage becomes larger than 8 V, and the brightness was 1500 cd/m$^2$ and the current density was 2.6 A/cm$^2$, responding to application of electric voltage of 12 V. According to the above result, it was confirmed that the inorganic-material-based film having thickness of 10 nm functioned as an electron-transport layer. As illustrated, conventional efficiency was obtained with low electric voltage, using such a thick inorganic-material-based layer formed as an electron-transport layer. By disposing the light-emitting device on a light-extraction structure, highly efficient light-emitting device may be obtained, while the risk for short-circuiting may be prevented because of the thick inorganic-material-based layer.

In the above description, configuration examples of the light-emitting device according to an aspect of the present invention and examples of methods for manufacturing the light-emitting device according to an aspect of the present invention are explained.

However, it is obvious for a person skilled in the art that the light-emitting device according to the present invention is not limited to the scope of the above examples.

For example, with respect to the light-emitting device according to the present invention, the light-extraction structure is not limited to be the scattering layer. As a light-extraction structure, the light-emitting device may be provided with various types of conventional mechanisms for enhancing light-extraction efficiency, such as a diffracting structure, a corrugated structure, a layer with a low refractive index, etc.

Additionally, the light-emitting device according to the present invention is not limited to an organic LED element. The light-emitting device may be provided with a light-emitting layer formed by inorganic material, etc. Furthermore, the present invention may be applied to, other than a light-emitting device, a power-generating device for solar batteries, etc., for enhancing light use efficiency.

INDUSTRIAL APPLICABILITY

The present invention may be applied to various types of light-emitting devices including an organic LED element, etc., and various types of power-generating devices.

What is claimed is:

1. A light-emitting device having a light-extraction structure,
the light-emitting device comprising:
a first electrode;
a second electrode;
a light-emitting layer disposed between the first electrode and the second electrode; and an inorganic-material-based layer disposed between the first electrode and the light-emitting layer or between the second electrode and the light-emitting layer, wherein the inorganic-material-based layer has thickness of 100 nm or more and has conductivity of $10^{-6}$ $\Omega^{-1}$ cm$^{-1}$ or more and 100 $\Omega^{-1}$ cm$^{-1}$ or less, wherein the inorganic-material-based layer comprises of a zinc-silicon-oxide-based material, and wherein the zinc-silicon-oxide-based material contains zinc (Zn), silicon (Si), and oxygen (O) at an atomic fraction, according to which Zn/(Zn+Si) is in a range of 0.30 to 0.8.

2. The light-emitting device according to claim 1, wherein the inorganic-material-based layer contains amorphous oxide.

3. The light-emitting device according to claim 1, wherein the light-emitting layer is an organic light-emitting layer.

4. The light-emitting device according to claim 1, wherein the first electrode is a transparent electrode and the second electrode is a reflective electrode.

5. The light-emitting device according to claim 4, wherein a transparent substrate is disposed on a side of the first electrode, the side being opposite to a side on which the second electrode is disposed.

6. The light-emitting device according to claim 5,
wherein the light-extraction structure is constituted by a scattering layer disposed between the first electrode and the transparent substrate, and wherein the scattering layer includes a base material made of glass and a plurality of scattering substances dispersed inside the base material.

7. The light-emitting device according to claim 1, wherein the inorganic-material-based layer is disposed between the first electrode and the light-emitting layer.

8. The light-emitting device according to claim 7, wherein the inorganic-material-based layer is disposed in contact with the first electrode.

9. A power-generating device, comprising:

a first electrode;

a second electrode;

a power-generating layer disposed between the first electrode and the second electrode; and an inorganic-material-based layer disposed between the first electrode and the power-generating layer or between the second electrode and the power-generating layer, wherein the inorganic-material-based layer has thickness of 100 nm or more and has conductivity of $10^{-6}$ $\Omega^{-1}$ cm$^{-1}$ or more and 100 $\Omega^{-1}$ cm$^{-1}$ or less, wherein the inorganic-material-based layer comprises of a zinc-silicon-oxide-based material, and wherein the zinc-silicon-oxide-based material contains zinc (Zn), silicon (Si), and oxygen (O) at an atomic fraction, according to which Zn/(Zn+Si) is in a range of 0.30 to 0.8.

* * * * *